United States Patent
Yuu et al.

(10) Patent No.: US 7,044,587 B2
(45) Date of Patent: May 16, 2006

(54) ACTUATOR, ITS MANUFACTURING METHOD AND PRINTING HEAD

(75) Inventors: Yoshihiro Yuu, Kokubu (JP); Daisuke Takahashi, Kokubu (JP); Makoto Higashibeppu, Kokubu (JP); Chitoshi Ueki, Kokubu (JP); Hiroshi Aida, Kokubu (JP)

(73) Assignee: Kyocera Corporation, Kyoto (JP)

( * ) Notice: Subject to any disclaimer, the term of this patent is extended or adjusted under 35 U.S.C. 154(b) by 158 days.

(21) Appl. No.: 10/687,947

(22) Filed: Oct. 17, 2003

(65) Prior Publication Data

US 2004/0113995 A1    Jun. 17, 2004

(30) Foreign Application Priority Data

Oct. 17, 2002 (JP) ............... 2002-303548
Oct. 21, 2002 (JP) ............... 2002-306276
Oct. 25, 2002 (JP) ............... 2002-311829

(51) Int. Cl.
*B41J 2/45* (2006.01)
(52) U.S. Cl. .................. 347/68; 347/70; 347/71
(58) Field of Classification Search .......... 347/68–72; 252/62.9 PZ; 310/358
See application file for complete search history.

(56) References Cited

U.S. PATENT DOCUMENTS

| 5,719,607 | A | * | 2/1998 | Hasegawa et al. | ............ 347/70 |
| 6,097,133 | A | * | 8/2000 | Shimada et al. | ............ 310/358 |
| 6,142,615 | A | * | 11/2000 | Qiu et al. | ............ 347/70 |
| 6,730,354 | B1 | * | 5/2004 | Gilbert et al. | ......... 427/255.32 |
| 6,842,166 | B1 | * | 1/2005 | Hasegawa et al. | ......... 345/107 |
| 6,900,579 | B1 | * | 5/2005 | Kanno et al. | ............. 310/358 |

FOREIGN PATENT DOCUMENTS

| JP | 07-315923 | 12/1995 |
| JP | 10-151739 | 6/1998 |
| JP | 11-034321 | 2/1999 |

* cited by examiner

*Primary Examiner*—Manish Shah
*Assistant Examiner*—Geoffrey Mruk
(74) *Attorney, Agent, or Firm*—Hogan & Hartson, LLP (57) ABSTRACT

An actuator 1 in which a displacement element 7 has a piezoelectric ceramic layer 4 and a pair of electrodes 5, 6 interposing therebetween the piezoelectric ceramic layer 4. The entire thickness of the actuator 1 is 100 μm or less. The piezoelectric ceramic layer 4 and the substrate 2 have as their principal component a perovskite crystal containing at least Pb; Zr and Ti, and, the maximum difference in a composition ratio Pb/(Ti+Zr) between the surface of the piezoelectric ceramic layer 4 and the inside of the substrate 2 is 0.02 or less. This reduces characteristic variation.

14 Claims, 4 Drawing Sheets

ACTUATOR, ITS MANUFACTURING METHOD AND PRINTING HEAD

BACKGROUND OF THE INVENTION

1. Field of the Invention

The present invention relates to an actuator composed of a sintered body of thin layer having as its principal component a piezoelectric ceramic layer containing Pb, Zr and Ti, and a manufacturing method of the actuator, as well as a printing head that is suitable for inkjet printer used in printing characters and images.

2. Description of Related Art

In recent years, as a printer outputting information to a printing medium, the use of printers of inkjet type is being rapidly expanded along with the spread of personal computers and the development of multimedia.

A printing head is mounted on such an inkjet printer. As the printing head of this type, thermal head type and piezoelectric type are generally known. In the thermal head type, by a heater disposed in an ink passage filled with ink, the ink is heated and boiled to cause bubbles in the ink passage, so that the ink is pressurized and discharged through an ink outlet orifice. Whereas in the piezoelectric type, the wall of a part of an ink passage filled with ink is bent and displaced by displacement elements, so that the ink in the ink passage is mechanically pressurized and discharged through an ink outlet orifice.

Figure 4A:
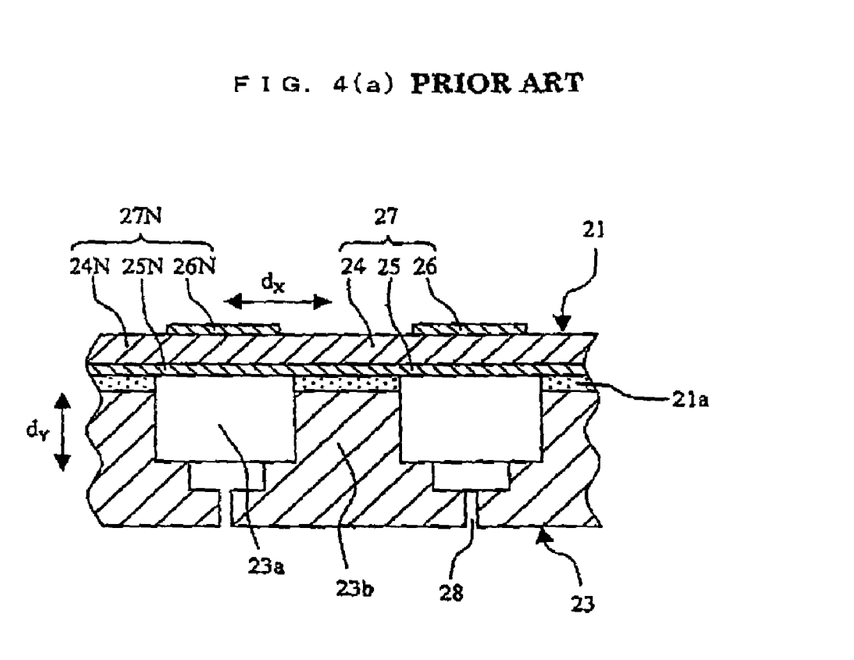
FIG. 4(a) is a schematic sectional view of a conventional printing head.

A printing head used for inkjet printer of the piezoelectric type is disclosed, for example, in Japanese Patent Unexamined Publication No. 10-151739. That is, the printing head of this type is, as shown in FIG. 4($a$), an actuator 21 is provided via an adhesive layer 21$a$ on a passage member 23 in which a plurality of grooves are arranged in parallel as ink passages 23$a$, and partition walls 23$b$ are formed as a wall for partitioning the individual ink passages 23$a$.

The actuator 21 is provided with a plurality of displacement elements 27 which are obtained by forming a common electrode 25 on one surface of a piezoelectric layer 24 and a plurality of separate electrodes 26 on the other surface. The actuator 21 and passage member 23 are bonded to each other such that the separate electrodes 26 are arranged immediately above the ink passage 23$a$ that is an opening part of the passage member 23.

Then, by applying a driving voltage from a drive circuit to between the common electrode 25 and the separate electrode 26, the displacement elements 27 are vibrated and they constitute part of the ink passage 23$a$. Thereby, the ink in the ink passage 23$a$ is pressurized and a drop of ink is discharged from an ink outlet orifice 28 that is opened in the bottom surface of the passage member 23.

In this construction, when a driving voltage is impressed to the common electrode 25 and separate electrode 26, although the piezoelectric layer 24 extends in the direction of plane direction $d_X$, a portion (constraint part) of the piezoelectric layer 24 is constrained which is joined to the partition walls 23$b$ disposed in the periphery of the ink passage 23$a$. Therefore, a portion of the piezoelectric layer 24 which is not constrained (non-constraint part) deflects in the direction of thickness direction $d_Y$, and pressure is exerted on the ink passage 23$a$, so that a drop of ink is discharged through the ink outlet orifice 28 connected in communication to the ink passage 23$a$.

Figure 4B:
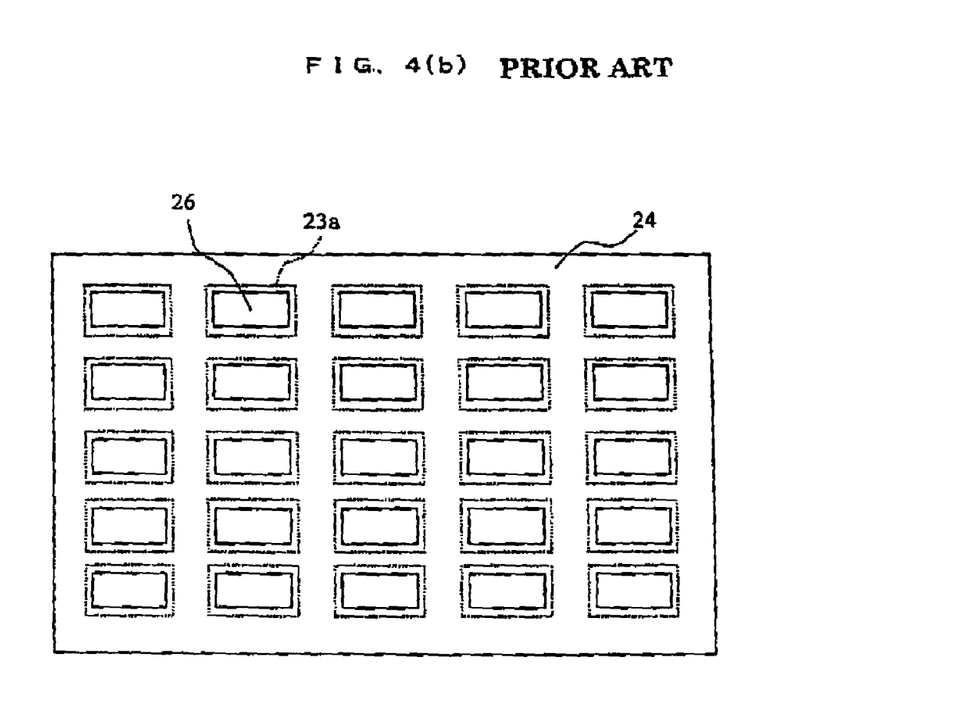
FIG. 4(b) is its schematic plan view.

As shown in FIG. 4($b$), the printing head is formed by disposing in parallel a large number of separate electrodes 26 on the piezoelectric layer 24, and providing a large number of displacement elements 27. Independent control of the individual displacement elements 27 contributes to higher speed and higher accuracy of the inkjet printer.

Japanese Patent Unexamined Publication Nos. 11-34321 and 7-315923 disclose that the above-mentioned actuator can realize a piezoelectric element excellent in thermal resistance, durability and temperature change resistance, by using a perovskite compound containing, as a metal component, at least one selected from Pb, Zr, Ti, Zn, Sb, Ni, Te, Sr and Ba.

In the case of using such an actuator as the printing head of an inkjet printer, it is important to suppress displacement variation in the actuator. However, when a sintered body is used as a piezoelectric ceramic layer, there is the problem that displacement variation is large because of large variations in characteristics. As the result, due to variations in ink discharge, there occur large variations in the density of characteristics and images, so that contrast is poor and high-speed printing is impracticable.

In recent high-accuracy printers, there is a tendency of reducing thickness in order to increase displacement as an actuator. Therefore, in order to directly obtain a piezoelectric sintered body having a thickness of, for example, 100 µm or less, particularly 60 µm or less, when firing is carried out at high temperatures of 1000° C. or more, Pb evaporates from the surface of a molding body, thus causing a composition change and variations in the composition of the obtained piezoelectric sintered body. The use of such an actuator as the printing head of an inkjet printer suffers from the problem that displacement variation is increased to cause variations in ink discharge and a partial deterioration in the contrast of characters and images to be printed, thus failing to perform high-speed printing.

Additionally, in order to obtain an actuator of 100 µm or less, if an attempt were made to use only a central part of less composition variation by removing a surface part from which Pb has been evaporated, from a thick piezoelectric porcelain obtained by firing, it is actually difficult to cut ceramics in a small thickness of 100 µm or less. It is therefore difficult to manufacture an actuator that is composed of a thin ceramics free of composition variation.

In contrast, when the thickness of the actuator 21 is 100 µm or less, there is the problem that the residual stress during firing and shrinkage causes deformation and the stress caused by the restraint of the partition wall 23$b$ reduces the displacement amount of the displacement element 27.

Additionally, since the adhesive layer 21$a$ is not controlled to a specific thickness, when displacement elements 27N corresponding to the adjacent ink passage 23$a$ cause displacement simultaneously, there is the following problem. That is, the constrained portion of the piezoelectric layer 24 that must be constrained by the partition wall 23$b$ does not exert sufficient constraining force, so that the adjacent displacement elements 27 and 27N interfere with each other, thereby increasing displacement variation. This problem becomes significant especially when the partition wall 23$b$ has a small thickness.

SUMMARY OF THE INVENTION

The present invention has been achieved by succeeding in manufacturing actuators of less characteristic variations, based on a novel finding that the composition variation generated from the surface to its thickness direction can greatly be reduced by controlling the composition ratio Pb/(Ti+Zr) in piezoelectric ceramics containing Pb, Zr and Ti.

Specifically, a first actuator of the present invention comprises basically a substrate and a displacement element that is disposed on the surface of the substrate and composed of a piezoelectric ceramic layer and a pair of electrodes interposing therebetween the piezoelectric ceramic layer. The entire thickness of this actuator is 100 μm or less. The piezoelectric ceramic layer and the substrate have, as their principal component, a perovskite crystal containing at least Pb, Zr and Ti. The maximum difference in the composition ratio Pb/(Ti+Zr) between the surface of the piezoelectric ceramic layer and the inside of the substrate is 0.02 or less.

A manufacturing method of the actuator of the present invention comprises basically the step of preparing a laminate provided with electrodes in its inside and surface by stacking green sheets having, as its principal component, a perovskite crystal containing at least Pb, Zr and Ti; and the step of firing the laminate in a high-concentration oxygen atmosphere. At this time, according to the present invention, the amount of Pb contained in the green sheets is greater than the amount of Pb corresponding to the stoichiometric composition of the perovskite crystal. This enables to manufacture the above-mentioned actuator of the present invention.

When stress is exerted on a piezoelectric element of thin layer, its electrostatic capacity lowers, which induces characteristic variation of the actuator. For this, strictly controlling the lattice constant ratio of the perovskite compound and approximating the crystal phase of the piezoelectric ceramic layer to tetragonal can suppress a drop in electrostatic capacity even if compressive stress is exerted. Especially when a support member having a plurality of constraint parts is joined and compressive stress is applied, an actuator maintaining excellent piezoelectric property is realized This leads to success in providing the actuator of less composition variation even when firing is performed in a thickness of 100 μm or less, as well as the printing head for inkjet having an improvement in displacement variation.

Accordingly, a second actuator of the present invention comprises basically a ceramic substrate and a plurality of displacement elements that are disposed on the surface of this substrate and provided with a piezoelectric ceramic layer and a pair of electrodes interposing therebetween the piezoelectric ceramic layer. The thickness of the actuator is 100 μm or less. The piezoelectric ceramic layer is composed of a perovskite compound containing Pb, Zr and Ti. The lattice constant ratio c/a of this perovskite compound is 1.013 to 1.016.

Further, by controlling the thickness of an adhesive layer and d constant in an actuator having a thickness of 100 μm or less, the interference between the adjacent displacement elements can be suppressed thereby to provide sufficiently large amount of displacement and also reduce displacement variation.

Accordingly, a third actuator of the present invention includes a substrate, a plurality of displacement elements disposed on one surface of the substrate, and a plurality of constraint parts bonded via an adhesive layer to the other surface of the substrate. The displacement elements act independently so as to induce displacement at non-constraint parts that are not constrained by the constraint parts. The entire thickness of this actuator is 100 μm or less, d constant is 200 pm/V or more, and the thickness of the adhesive layer is 0.5 μm to 5 μm.

Thus, the thickness of the adhesive layer and d constant are controlled in the actuator having a thickness of 100 μm or less. It is therefore possible to prevent the interference between the adjacent displacement elements and also suppress displacement variation of the actuator. Such interference can be suppressed more effectively by controlling the ratio of the partition wall thickness to the substrate thickness.

The printing head of the present invention includes a passage member having a plurality of ink passages and the above-mentioned actuator provided with a plurality of displacement elements disposed on the passage member. The displacement elements are located immediately above an ink passage, and the ink charged in the ink passage is discharged by the displacement of the displacement elements. This enables to suppress variations in the amount of a drop of ink and in discharge velocity, thereby realizing high-speed and high-accuracy ink discharge.

DESCRIPTION OF PREFERRED EMBODIMENTS

<First Preferred Embodiment>

Figure 1A:
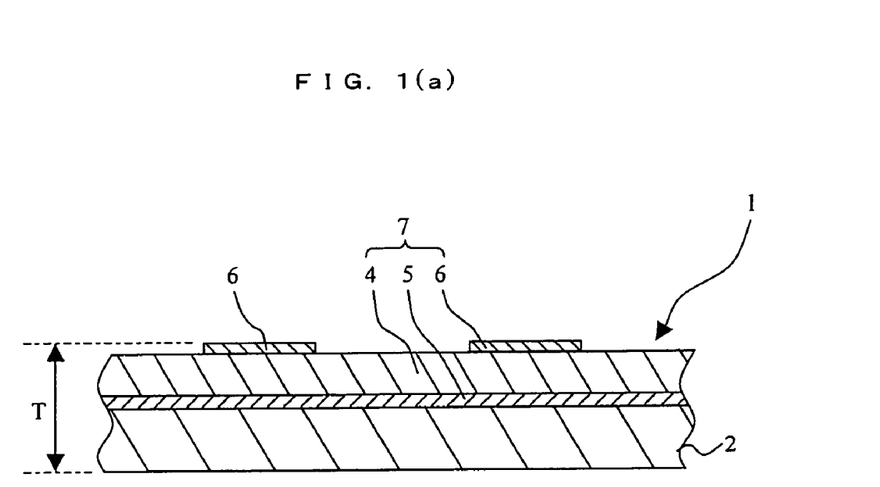
FIG. 1(a) is a schematic sectional view of an actuator according to the present invention.

As shown in FIG. 1(a), an actuator of the present invention is provided with a plurality of displacement elements 7 on the surface of a ceramic substrate 2. The displacement element 7 comprises a common electrode 5 disposed on the ceramic substrate 2, a piezoelectric ceramic layer 4 disposed on the common electrode 5, and separate electrodes 6 disposed on the piezoelectric ceramic layer 4. That is, the displacement element 7 is constructed such that the common electrode 5 and separate electrodes 6 interpose therebetween the piezoelectric layer 4, and the common electrode 5 is disposed on the ceramic substrate 2.

Figure 1B:
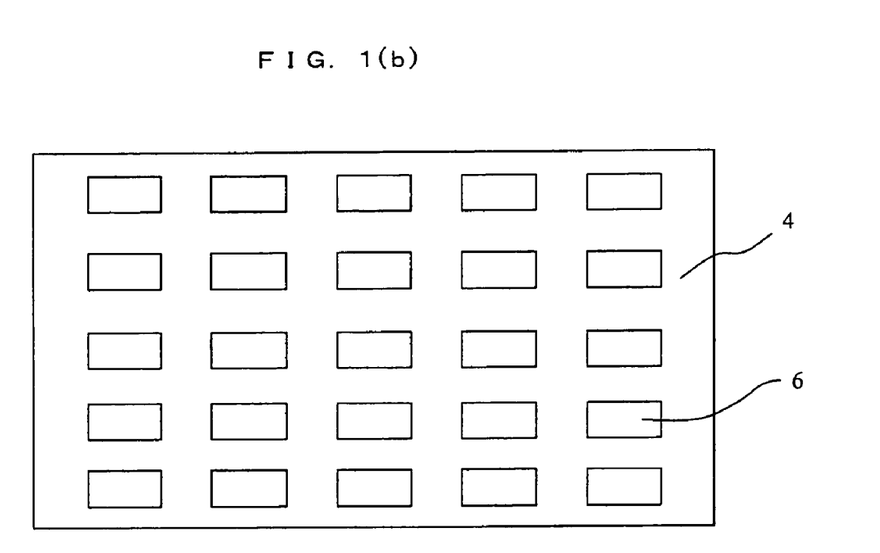
FIG. 1(b) is its plan view.

The plurality of the displacement elements 7 are disposed on the ceramic substrate 2. As shown in FIG. 1(b), the separate electrodes 6 are arranged at equally spaced intervals and in two-dimension, and they are independently connected to external electronic-controlled circuits, respectively. Voltage impression to each pair of electrodes can cause displacement in a part of the piezoelectric ceramic layer 4, which is interposed between the voltage-impressed common electrode 5 and separate electrode 6.

It is important that the piezoelectric ceramic layer 4 constituting the displacement element 7 has, as its principal component, a perovskite crystal containing at least Pb, Zr and Ti. For example, this crystal contains Pb as a constituent element at site A, and contains Zr and Ti as a constituent element at site B. Such a composition permits a piezoelectric ceramic layer having a high piezoelectric constant.

As a specific example of the above-mentioned perovskite crystal, $PbZrTiO_3$ can be illustrated. Alternatively, other oxide may be mixed therein. Further, as a sub-component, other element may be substituted for site A and/or site B, as long as no characteristics is affected. For example, as a sub-component, Zn, Sb, Ni and Te may be added to obtain solid solution of $Pb(Zn_{1/3}S_{2/3})O_3$ and $Pb(Ni_{1/2}Te_{1/2})O_3$.

In accordance with the present invention, it is desirable to further contain an alkaline earth element as a constituent element at site A in the above-mentioned perovskite crystal. Examples of alkaline earth element are Ba, Sr, Ca, etc. Particularly, Ba and Sr are preferable in the point of obtaining large displacement. This improves relative dielectric constant thereby to exhibit a still higher piezoelectric constant.

As a specific example, there is a compound expressed by $Pb_{1-x-y}Sr_xBa_y(Zn_{1/3}Sb_{2/3})_a(Ni_{1/2}Te_{1/2})_bZr_{1-a-b-c}Ti_cO_3+\alpha$ wt. % $Pb_{1/2}NbO_3$ ($0 \geq x \geq 0.14$, $0 \geq y \geq 0.14$, $0.05 \geq a \geq 0.1$, $0.02 \geq b \geq 0.01$, $0.44 \geq c \geq 0.50$, $\alpha = 0.1$ to 1.0).

It is also possible to use other perovskite crystal containing Pb, Zr and Ti, such as lead magnesium niobium oxide (PMN) and lead nickel niobium oxide (PNN).

The ceramic substrate 2 should be of high insulating property. It is preferably a piezoelectric element, especially having an approximately the same thermal expansion rate as the piezoelectric ceramic layer 4. In addition, the ceramic substrate is preferably a piezoelectric element and has approximately the same composition as the piezoelectric ceramic layer 4. This permits simultaneous firing and it is easy to avoid that warp and strain are caused by the thermal stress that occurs during firing due to a difference in thermal expansion.

Although the ceramic substrate 2 may be a single layer, it is preferably a laminate in order to control thickness and suppress the composition variation and characteristic variation after sintering.

For the actuator of the present invention, it is important that the maximum difference between Pb/(Ti+Zr) ratio in the surface of the piezoelectric ceramic layer 4 and Pb/(Ti+Zr) ratio in the inside of the substrate 2 is suppressed to 0.02 or less. When the maximum difference is greater than 0.02, the composition drift of the surface part may cause characteristic variation in the displacement element 7.

When the actuator having the composition so controlled is applied to the printing head of an inkjet printer of piezoelectric type, ink discharge variation can be suppressed to permit a considerable contribution to an improvement in printer characteristics such as print speed and contrast.

In accordance with the present invention, a single separate electrode 6 may be provided, however, it is preferable to dispose a plurality of separate electrodes 6 in order to increase print speed and print accuracy.

As the material of the common electrode 5 and separate electrode 6, any conductive material may be used. For example, Au, Ag, Pd, Pt, Cu, Al, or alternatively their alloys can be used. The common electrode 5 and separate electrode 6 are also required to have such a thickness as to secure conductivity and not to inhibit displacement. Preferred thickness is approximately 0.5 to 5 μm, particularly, 1 to 3 μm.

The feature that thickness T of the actuator of the present invention is 100 μm or less is important to obtain large displacement and satisfactorily exhibit the actuator characteristics. Thickness T is especially 80 μm or less, preferably 65 μm or less, more preferably 50 μm or less. Here, thickness T of the actuator indicates the total thickness of the substrate 2 and displacement element 7. A lower limit value of thickness T of the actuator is 3 μm, especially 5 μm, preferably 10 μm, more preferably 20 μm, in order to hold sufficient mechanical strength and prevent breakdown during handling and operation.

The porosity of the displacement element 7 is 1% or less, preferably 0.5% or less. The strength of the actuator 1 increases by reducing the porosity. When used as an inkjet printing head, ink leak due to ink soak into porcelain can be suppressed effectively.

When the actuator of the present invention is used as the printing head of an inkjet printer, for example, $d_{31}$ mode is usable as a piezoelectric strain constant. In order to exhibit sufficient discharge capability as the printing head of the inkjet printer and also realize high-speed and accurate printing, $d_{31}$ is preferably 200 pm/V or more, particularly 225 pm/V or more, more preferably 250 pm/V or more.

The following is a manufacturing method of an actuator according to the present invention, taking as a specific example the case that $PbZrTiO_3$ perovskite crystal is applied to the printing head of an inkjet printer.

First, $Pb_2O_3$, $ZrO_2$, $TiO_2$, $BaCO_3$, ZnO, $SrCO_3$, $Sb_2O_3$, NiO, $TeO_2$ are prepared as raw material powder. These are adjusted to a composition to which Pb is added so as to be greater than the amount of Pb corresponding to the stoichiometric composition of the perovskite crystal, followed by mixing. Especially, adjustment of the amount of Pb to 1 to 5 wt. % excess, particularly 2 to 4 wt. % excess to the above stoichiometric composition, is preferable in order to reduce characteristic variation and exhibit excellent piezoelectric property.

By a normal tape molding process such as roll coater process and slit coater process, the obtained mixed powder is molded in a tape consisting of a piezoelectric ceramic layer and an organic composition, and a green sheet is prepared. Since the content of Pb in this green sheet is greater than the amount of Pb corresponding to the stoichiometric composition of the perovskite crystal, the composition variation in the porcelain after being subject to firing can be reduced considerably. This is important to obtain the actuator of the present invention.

A common electrode and separate electrodes are formed by printing etc. on the surface of a part of the green sheet. Additionally, as desired, a via hole is formed in a part of the green sheet, and a via conductor is inserted into the inside of the via hole.

Subsequently, a desired green sheet is stacked to prepare a laminate. Further, a constraint sheet, which is obtained by adding an organic composition into a composition substantially the same as the green sheet, is disposed on both or one surface of the laminate, and then pressurized and tightened.

The pressurized and tightened laminate is placed in the inside of a kiln and fired at a firing temperature of 900° C. or more, particularly 950 to 1100° C., under high-concentration oxygen atmosphere. This avoids that due to the evaporation of Pb in the laminate, the composition becomes a deficiency of Pb than the above-mentioned perovskite composition, thereby obtaining a piezoelectric ceramics that is 0.02 or less in the maximum difference of composition ratio Pb/(Ti+Zr) ratio.

It is desirable that the density of the green sheet after being pressurized and tightened is 4.2 g/cm² or more, particularly 4.5 g/cm² or more, in order that the evaporation of Pb from the inside is reduced to further facilitate the suppression of the composition variation in Pb.

It is also desirable that the oxygen concentration in the oxygen atmosphere during firing is 98% or more, particularly 99% or more. This produces the effect of suppressing the decomposition of lead oxide and further reducing the amount of evaporation of Pb, and suppressing composition variation, resulting in a smaller displacement variation as an actuator.

The actuator so manufactured is composed of a piezoelectric porcelain of 100 μm or less that is free of composition variation. It is also easy to suppress displacement variation to 10% or less. This actuator can suitably serve as an actuator used for the printing head of an inkjet printer.

A printing head of the present invention includes a passage member and the above-mentioned actuator disposed on the passage member, in which the ink charged in an ink passage provided in the passage member is discharged by the displacement of the above-mentioned displacement elements constituting the above-mentioned actuator.

An example of the printing head of the present invention will be described by using FIG. 2(a). A passage member 13 having such a structure that ink passages 13a, which are a plurality of grooves are partitioned by partition walls 13b, is bonded to the actuator 11 of the present invention. That is, a substrate 12 is bonded with adhesive to the surface of the passage member 13, and a plurality of displacement elements 17 are disposed on the substrate 12. Portions joined to the displacement elements 17 on the substrate 12 are disposed so as to overlap with the ink passages 13a that are opening parts of the passage member 13.

The displacement element 17 has such a structure that the common electrode 15 is formed on one main surface of the piezoelectric ceramic layer 14 and separate electrodes 16 are formed on the other main surface, and a pair of the electrodes 15 and 16 interpose therebetween the piezoelectric ceramic layer 14.

The common electrode 15 and separate electrode 16 of the displacement element 17 is electrically connected to an external drive circuit. When voltage is impressed through the drive circuit to between the common electrode 15 and separate electrode 16, as shown in FIG. 2(b), the ink in the ink passage 13a, which corresponds to the displacement element 17 that is displaced by the impression of voltage, is pressurized and a drop of ink is discharged through an ink outlet orifice 18 that is opened in one end surface of the passage member 13.

As shown in FIG. 4(b), the printing head of the present invention is provided with a plurality of displacement elements arranged on the substrate, and the individual displacement elements are controlled independently to cause individual displacement.

The employment of this construction provides a stably high-speed and high-accuracy discharge, thus leading to a printing head suitable for printer realizing images of high contrast at high speed.

<Second Preferred Embodiment>

The effect of the present invention can sufficiently be exhibited especially when the actuator 1 of the present invention as shown in FIGS. 1(a) and 1(b) has such a structure that, on the surface on the opposite side of the surface of the ceramic substrate 2 on which the displacement elements 7 are disposed, a constraint part composed of metal is disposed via an adhesive layer so as to cause displacement in a non-constraint part. That is, since the constraint part composed of metal is disposed via the adhesive layer composed of metal, compression stress is exerted on the piezoelectric ceramic layer 4, and displacement occurs in the non-constraint part.

Figure 3A:
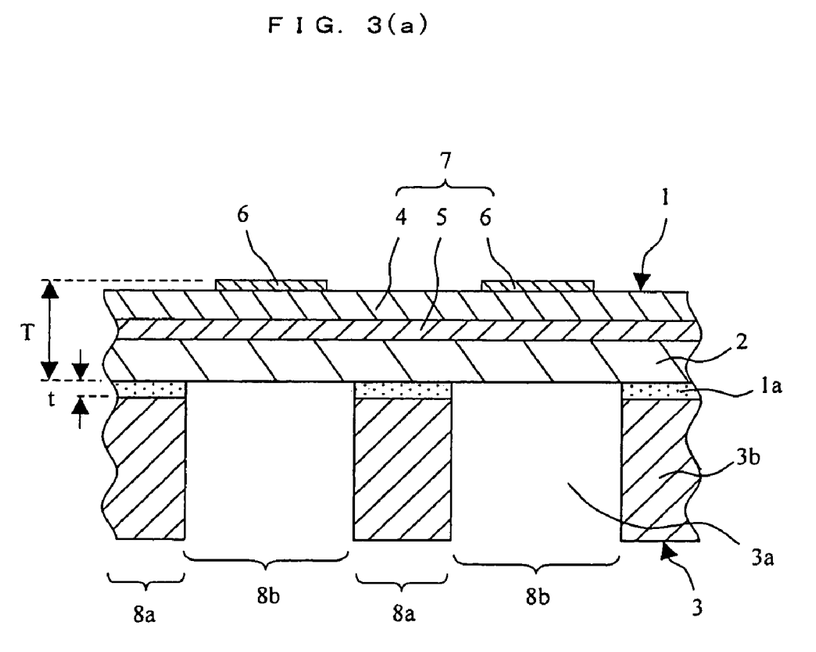
FIG. 3(a) is a schematic sectional view in the case that a constraint part is provided in an actuator.

Concretely, as shown in FIG. 3(a). a support member 3 is fixed to the ceramic substrate 2 of the actuator of the present invention. Non-constraint part 8b (free vibration part) located at the opening part of a groove, and a constraint part 8a (fixed part) formed by joining are formed on the surface of the ceramic substrate 2 joined to the support member 3.

When voltage is impressed between the common electrode 5 and separate electrode 6, the displacement of the piezoelectric ceramic layer 4 causes the displacement of the displacement element 7, so that vibration occurs at the non-constraint pan 8b. This structure enables to make full use of the feature of the actuator causing large displacement.

It is important that the piezoelectric ceramic layer 4 constituting the displacement element 7 has, as its principal component, a perovskite crystal containing at least Pb, Zr and Ti. For example, this crystal preferably contains Pb as a constituent element at site A, and contains Zr and Ti as a constituent element at site B, especially a lead zirconate titanate-based compound, in order to obtain a stable piezoelectric sintered body having a higher d constant.

Further, the above-mentioned piezoelectric ceramic layer preferably contains at least one of Sr, Ba, Ni, Sb, Nb, Zn and Te. This enables to obtain a more stable piezoelectric sintered body. For example, solid solution of $Pb(Zn_{1/3}Sb_{2/3})O_3$ and $Pb(Ni_{1/2}Te_{1/2})O_3$ is employed as a sub-composition.

It is especially preferred to further contain an alkaline earth element as a constituent element at site A. As an alkaline earth element, Ba and Sr are especially preferred in the point of obtaining large displacement. It is especially advantageous to contain Ba in an amount of 0.02 to 0.08 mol, and Sr in an amount of 0.02 to 0.12 mol, for obtaining large displacement particularly when tetragonum composition is the principal composition.

For example, the amount of Pb is added in 1 to 5 wt. % excess to a compound expressed by $Pb_{1-x-y}Sr_xBa_y(Zn_{1/3}Sb_{2/3})_a$ $(Ni_{1/2}Te_{1/2})_bZr_{1-a-b-c}Ti_cO_3+\alpha$ wt. % $Pb_{1/2}NbO_3$ ($0 \geq x \geq 0.14$, $0 \geq y \geq 0.14$, $0.05 \geq a \geq 0.1$, $0.02 \geq b \geq 0.01$, $0.44 \geq c \geq 0.50$, $\alpha = 0.1$ to $1.0$).

When a molding body in which Pb is adjusted to stoichiometric composition is fired at 1000° C. for two hours, Pb is completely evaporated as PbO, and the drift of composition in the surface part occurs. This causes drift in the composition of the surface part, so that the characteristics of displacement elements is liable to deteriorate and characteristic variation is liable to occur. It is preferred that Pb is added in excess of the stoichiometric composition, especially that the excess ratio at site A is 1.005 to 1.04, particularly 1.01 to 1.03. This facilitates to suppress the Pb/(Ti+Zr) ratio in the thickness direction of the displacement element 7 is 0.02 or less, thus further reducing composition variation.

Here, the "excess ratio at site A (A/B ratio)" is obtained by the sum of the mol numbers of the entire component at site A is divided by the sum of the mol numbers of the entire composition at site B. It means that while A/B ratio is 1 in stoichiometric perovskite oxide, Pb and other element are added into site A in an amount greater than that. This is the state that A/B ratio is greater than 1.

The perovskite compound constituting the piezoelectric layer 4 normally has two types of crystal forms, which are generally present in a mixture of rhombus and tetragonal. In order to increase piezoelectric property, it is preferred to employ a composition phase forming a boundary between rhombus and tetragonal. However, when an actuator having a thickness T of 100 μm or less is fired, Pb is evaporated to change the composition of piezoelectric element extending from the actuator surface to its inside, resulting in property deterioration. In contrast, according to the present invention, excellent property can be maintained, and property deterioration can be suppressed even under stress environment, by controlling lattice constant ratio c/a, and mixing two types of crystal forms at a specific ratio.

That is, it is important that the lattice constant ratio c/a of the perovskite compound of the piezoelectric ceramic layer 4 is set to 1.013 to 1.016. This enables to bring the principal element of the perovskite compound into tetragonal composition. For obtaining fairly stable piezoelectric property, the lattice constant ratio c/a is 1.0135 to 1.0155, preferably 1.014 to 1.015.

The feature that the thickness of the displacement element 7 is 100 μm or less is important for obtaining large displacement. Especially 80 μm or less, preferably 65 μm or less, more preferably 50 μm or less is preferred to increase displacement. Its lower limit value is 3 μm, preferably 5 μm, more preferably 10 μm, in consideration of sufficient mechanical strength that is required to prevent breakdown during manufacturing and operation.

The ceramic substrate 2 should be of high insulating property, preferably a piezoelectric element, especially having approximately the same thermal expansion rate as the piezoelectric ceramic layer 4. In addition, the ceramic substrate is preferably a piezoelectric element and has approximately the same composition as the piezoelectric ceramic layer 4. This permits simultaneous firing, and it is easy to avoid that warp and strain are caused by the thermal stress that occurs during firing due to a difference in thermal expansion.

Although the ceramic substrate 2 may be a single layer, it is preferably a laminate in order to control thickness and suppress the composition variation and characteristic variation after sintering.

The piezoelectric strain constant suitable for the printing head of an inkjet printer is, for example, $d_{31}$. In order to exhibit sufficient discharge capability as the printing head of the inkjet printer, the magnitude of $d_{31}$ is required to be 200 pm/V or more. When it is lower than 200 pm/V, there is no sufficient discharge capability, failing to use as the inkjet printing head. For obtaining high-speed and high-accuracy printing, it is more preferred that $d_{31}$ is 250 pm/V or more.

The elastic compliance of the actuator is $14.0 \times 10^{-12}$ m$^2$/N or less, preferably $13.5 \times 10^{-12}$ m$^2$/N or, less, more preferably $13.0 \times 10^{-12}$ m$^2$/N or less. This facilitates to suppress a drop in electrostatic capacity to the stress that occurs after the actuator is bonded to the support member.

The porosity of the displacement element 7 is 1% or less, preferably 0.8% or less, more preferably 0.5% or less. This enables to effectively prevent soak of liquid such as ink, thereby reducing ink leak.

As the material of the common electrode 5 and separate electrode 6, any conductive material may be used. For example, Au, Ag, Pd, Pt, Cu, Al, or alternatively their alloys can be used. The electrodes are required to have such a thickness as to secure conductivity and not to inhibit displacement. It is generally approximately 0.5 to 5 μm, preferably 1 to 4 μm.

The employment of this construction permits to independently and satisfactorily control the magnitude of displacement in the individual displacement elements 7 of the actuator. Therefore, the discharge amount of ink can be controlled accurately. This permits high-accuracy alignment and therefore provides a high-quality inkjet printing head causing less irregular discharge.

The following is a manufacturing method of the actuator of this preferred embodiment, taking as a specific example the case that a PbZrTiO$_3$ perovskite crystal is applied to the printing head of an inkjet printer.

First, Pb$_2$O$_3$, ZrO$_2$, TiO$_2$, BaCO$_3$, ZnO, SrCO$_3$, Sb$_2$O$_3$, NiO, TeO$_2$ are prepared as raw material powder. These are adjusted to a composition to which Pb is added so as to be greater than the amount of Pb corresponding to the stoichiometric composition of the perovskite crystal, followed by mixing. Especially from the viewpoint of maintaining excellent piezoelectric property, it is preferred to adjust the excess ratio at site A to 1.005 to 1.04, particularly 1.01 to 1.03.

By a normal tape molding process such as roll coater process and slit coater process, the obtained mixed powder is molded in a tape consisting of piezoelectric ceramics and an organic composition, and a green sheet is prepared.

A common electrode and separate electrodes are formed by printing method etc. on the surface of a part of the green sheet. Additionally, as desired, a via hole is formed in a part of the green sheet, and a via conductor is inserted into the inside of the via hole.

Subsequently, a desired green sheet is stacked to prepare a laminate. Further, a constraint sheet, which is composed of piezoelectric ceramics and an organic composition that have substantially the same composition as the green sheet, is disposed on both or one surface of the laminate, and then pressurized and tightened.

The laminate after pressurization and tightening is placed in the inside of a kiln and fired at a firing temperature of 900° C. or more, particularly 950 to 1100° C., under high-concentration oxygen atmosphere. This avoids that due to the evaporation of Pb in the laminate, the composition becomes a deficiency of Pb than the above-mentioned perovskite composition, thereby obtaining a piezoelectric sintered body that is 0.02 or less in the variations of composition ratio Pb/(Ti+Zr) ratio.

The firing is preferably carried out in an oxygen atmosphere. From the viewpoint of suppressing the evaporation of Pb and reducing density variation, the oxygen concentration is 80% or more, particularly 90% or more, preferably 95% or more, more preferably 98% or more.

Figure 2A:
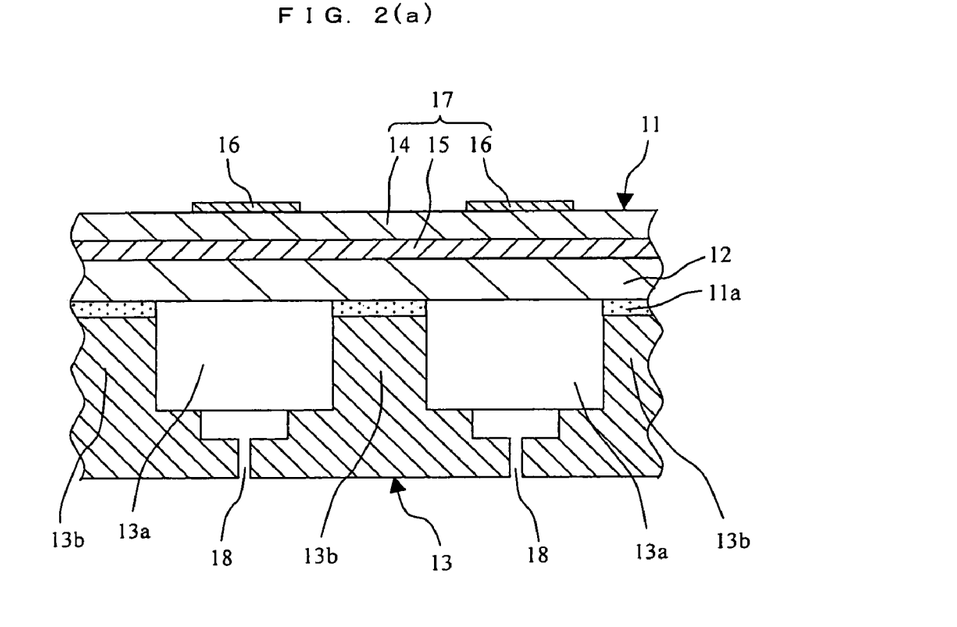
FIG. 2(a) is a schematic sectional view of a printing head according to the present invention.
Figure 2B:
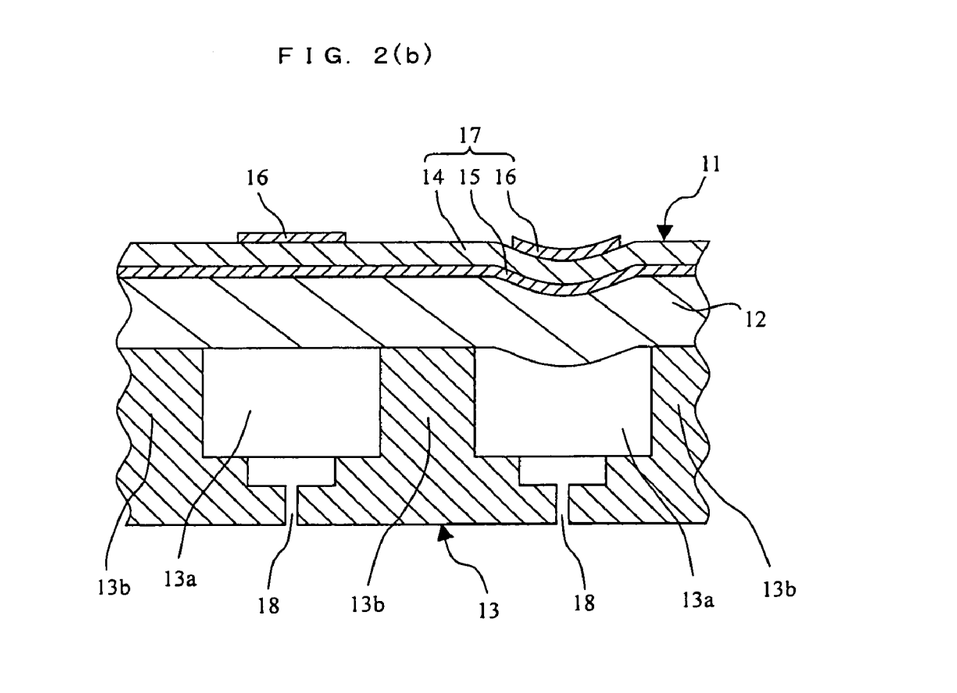
FIG. 2(b) is a schematic sectional view showing the state that displacement elements are displaced.

As shown in FIGS. 2(a) and 2(b), in the printing head of this preferred embodiment, an actuator 11 is bonded to a passage member 13. Since this printing head has high-speed and high-accuracy ink discharge performance, it is suitable for use in high-speed printing. This preferred embodiment is otherwise similar to the forgoing embodiment.

<Third Preferred Embodiment>

An actuator 1 of a third preferred embodiment is, as shown in FIG. 3(a), a substrate 2 is joined to a support member 3, and the substrate 2 and support member 3 are provided integrally via an adhesive layer 1a. A piezoelectric layer 4 is disposed on the surface of the substrate 2, a common electrode 5 is formed between the substrate 2 and piezoelectric layer 4, and a separate electrode 6 is disposed on the surface of the piezoelectric layer 4. The common electrode 5 and separate electrode 6 interpose therebetween the piezoelectric layer 4.

Figure 3B:
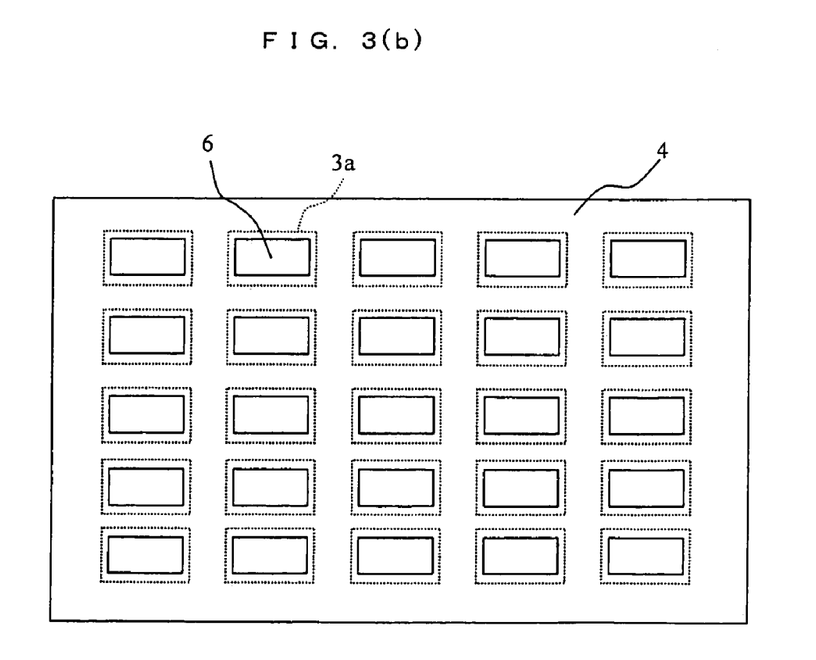
FIG. 3(b) is its plan view.

It is preferred, as shown in FIG. 3(b), to arrange a large number of separate electrodes 6 on the piezoelectric layer 4 at equally spaced intervals and in parallel to each other, and to provide a large number of displacement elements 7. In the application of the actuator having this structure to a printing head, independent control of the individual displacement elements 7 contributes to higher speed and higher accuracy of inkjet printers.

The separate electrodes 6 are connected independently to external electronic-controlled circuits, respectively. When voltage is impressed between the separate electrode 6 and common electrode 5, there occurs displacement at a portion of the piezoelectric layer 4, which is interposed between the voltage-impressed common electrode 5 and separate electrode 6.

Since the substrate 2 is partially fixed by a partition wall 3b of the support member 3, the main surface of the substrate 2 joined to the support member 3 is constructed by a constraint part 8a that is formed by joint and fixed, and a non-constraint part 8b that is located at the opening part of a groove 3a, so that it can be vibrated at the non-constraint part 8b.

Preferably, the piezoelectric layer 4 constituting the displacement elements 7 has a perovskite oxide as its principal component, and contains Pb as a constituent element at site A, and contains Zr and Ti as a constituent element at site B. More preferably, the piezoelectric layer 4 has solid solution of $Pb(Zn_{1/3}Sb_{2/3})O_3$ and $Pb(Ni_{1/2}Te_{1/2})O_3$, as its sub-component.

For example, piezoelectric ceramics having a lead zirconate titanate-based compound as its principal component is usable. Without limiting to this, any material having piezoelectric property may be used. The constituent of above-mentioned displacement elements is preferably high in piezoelectric strain constant $d_{31}$.

It is especially desirable to further contain an alkaline earth element as a constituent element at site. A in the perovskite oxide. Examples of alkaline earth element are Ba, Sr, Ca, etc. Particularly, Ba and Sr are preferred for obtaining large displacement.

Concretely, it is desirable to use a piezoelectric porcelain composition expressed by $Pb_{1-x-y}Sr_xBa_y(Zn_{1/3}Sb_{2/3})_a(Ni_{1/2}Te_{1/2})_bZr_{1-a-b-c}Ti_cO_3 + \alpha$ wt. % $Pb_{1/2}NbO_3$ ($0 \geq x \geq 0.14$, $0 \geq y \geq 0.14$, $0.05 \geq a \geq 0.1$, $0.02 \geq b \geq 0.01$, $0.44 \geq c \geq 0.50$, $\alpha = 0.1$ to $1.0$).

It is important that the entire thickness T of the actuator of the present invention is 100 μm or less, in order to attain higher performance, miniaturization and lower power consumption (lower voltage) by a large amount of displacement. Its lower limit value is especially 5 μm, preferably 10 μm, more preferably 20 μm, in order to have practical mechanical strength and withstand voltage strength. Its upper limit value is particularly 80 μm, preferably 60 μm, more preferably 45 μm, in order to increase displacement.

The substrate 2 and piezoelectric layer 4 have porosity of 1% or less, preferably 0.8% or less. Porosity greater than 1% is unsuitable because there is the possibility of ink leak due to ink soak when used as an inkjet printing head. It is also unsuitable from the viewpoint of porcelain strength.

As the material of the common electrode 5 and separate electrode 6, any conductive material may be used. For example, Au, Ag, Pd, Pt, Cu, Al, or alternatively their alloys can be used. The electrode 5 and separate electrode 6 are also required to have such a thickness as to secure conductivity and not to inhibit displacement. Preferred thickness is 1 to 5 μm.

In accordance with the present invention, it is important that d constant of the displacement elements 7 of the actuator 1 is 200 pm/V or more. When d constant is less than 200 pm/V, the amount of discharge as inkjet is lowered. It is especially preferable that d constant is 220 pm/V or more, further 250 pm/V or more, in order to stabilize discharge performance.

It is required to prevent abnormal deformation of the displacement elements 7 in the constraint part 8a when they are deformed. It is therefore important to set thickness t of an adhesive layer 1a to 0.5 to 5 μm. Especially for reducing the interference between the adjacent displacement elements 7, it is preferred to set the upper limit of thickness t of the adhesive layer 1a to 4 μm, further 3 μm, more suitably 2 μm, most suitably 1 μm.

In the presence of a large pore in the inside of the adhesive layer 1a, the amount of displacement of the displacement element 7 might be increased at the constraint part 8a at which such a large pore is present. This might increase the interference between the adjacent displacement elements 7. In order to prevent this, the maximum pore diameter of the pores in the inside of the adhesive layer 1a is preferably 10 μm or less, particularly 7 μm or less, further 5 μm or less.

Even when the adhesive layer 1a has a small thickness t, the adhesive layer 1a is preferably formed uniformly over the entire surface of a joining surface, and also holds such a bonding strength that is sufficient to withstand vibration.

The substrate 2 may be a single layer or laminated ceramics. It is especially preferred that the substrate 2 is composed of a piezoelectric layer 4 having substantially the same composition and approximately the same shape as the piezoelectric layer 4. In the case that the substrate 2 and piezoelectric layer 4 are of the same composition and the same shape, it is easy to control the shrinkage dimension during firing. This improves mass production and contributes to lower cost.

The thickness of the substrate 2 may be set to any value, for example, 10 to 80 μm, preferably 15 to 70 μm, more preferably 20 to 50 μm. This is to realize the miniaturization of inkjets.

The following is a manufacturing method of an actuator for inkjet printing head. First, piezoelectric powder raw material such as PZT is molded by a known molding process. For obtaining a uniform thin layer porcelain, it is especially preferred to mold a tape composed of piezoelectric ceramics and an organic composition by a normal tape molding process such as roll coater process and slit coater process.

In order to form electrodes at desired locations on the obtained green sheet surface, a conductive paste is applied by printing method or the like. As desired, via electrodes electrically connecting these electrodes and external electronic circuits are formed. Thereafter, the green sheet is stacked in a desired construction and then pressurized and tightened to form a laminate.

A constraint sheet is spread over the upper and lower surfaces of this laminate, and these are fired simultaneously to obtain a sintered body. Sand blast and ultrasonic cleaning are performed to the obtained sintered body in order to remove the constraint sheets, thereby obtaining an actuator substrate.

Separate electrodes are formed on the surface of the obtained porcelain, and a support member is then bonded to the porcelain. The bonding is performable by, for example, room temperature bonding such as silicon resin, and high temperature bonding in which the temperature of epoxy resin is 80 to 150° C.

At the time of bonding, it is preferred to perform pressurization in order to avoid that the adhesive layer becomes thick. For example, metal pressurized press is performed. As means for making a thin adhesive layer, the viscosity of adhesive is adjusted such that bonding is performed in the state of high flowability. It is preferred to set the viscosity to 100 to 200 psi, for example.

In addition, in order to avoid pores remaining in the adhesive layer, the atmosphere for performing bonding is preferably brought into the state of reduced pressure. Concretely, bonding is preferably performed in a degree of vacuum of 10 kPa or less, particularly 1 kPa or less, further 100 Pa or less. To decrease the viscosity of adhesive is also effective in preventing the remaining pores, and it is preferred to determine the reduced pressure state and viscosity in accordance with the type of adhesive and the method of bonding.

Furthermore, in order to increase bonding strength, it is preferred to clean the joining surface before bonding, and especially perform etching process for removing any oxide layer and decomposed layer. Although the amount of removal depends on the material, it is approximately 10 nm to 20 nm.

The actuator so prepared can control the adhesive layer thickness in the range of 0.5 to 5 μm, the actuator thickness in 100 μm or less, and d constant in 200 pm/V or more. This enables to realize such an actuator that exhibits a sufficient amount of displacement even when the support member is joined thereto, while causing less variation in the amount of displacement.

The printing head of the present invention is, as shown in FIGS. 2(a) and 2(b), obtained by joining the above-mentioned actuator 11 via the adhesive layer 11a to the passage member 13 having a plurality of ink passages 13a. Between the common electrode 15 and separate electrode 16 that are provided in the actuator 11, voltage is impressed to cause the displacement of the displacement elements 17 including the piezoelectric layer 14, so that ink is discharged through the ink outlet orifice 18.

An electrode pad is disposed on the separate electrode 16 so as to supply power thereto. Thickness t of the adhesive layer 11a serving as the joining surface between the actuator and support member is preferably 0.5 to 5 μm.

It is also preferable that the maximum diameter of pores contained in the adhesive layer 11a is 10 μm or less. This enables to prevent displacement variation of each displacement element and the interference between the adjacent displacement elements.

The application of the printing head so constructed to inkjet type printers realizes printers that can perform high-accuracy and high-speed printing. Higher-speed and higher-accuracy printing is possible by arranging a plurality of the printing heads in parallel to each other. This preferred embodiment is otherwise similar to the foregoing first preferred embodiment.

The actuators in accordance with the respective preferred embodiments have been described above. The actuators of the present invention may be a combination of two or three actuators in the first to third preferred embodiments. That is, preferred actuators are obtainable by combining two or three ones selected from (i) the preferred embodiment that at least, the maximum difference in composition ratio Pb/(Ti+Zr) between the surface of the piezoelectric ceramic layer and the inside of the substrate is 0.02 or less; (ii) the preferred embodiment that the lattice constant ratio c/a of a perovskite compound containing Pb, Zr and Ti is 1.013 to 1.016; and (iii) the preferred embodiment that individual displacement elements are operated independently such that a non-constraint part not constrained by a constraint part bonded via an adhesive layer to the other surface of the substrate, d constant is 200 pm/V or more, and the thickness of the adhesive layer is 0.5 to 5 μm.

Additionally, many other variations and modifications and other uses will become apparent to those skilled in the art. Therefore, the present invention is to be limited not by the specific disclosure herein but only by the appended claims.

The following examples illustrate the manner in which the present invention can be practiced. It is understood, however, that the examples are for the purpose of illustration and the invention is not to be regarded as limited to any of the specific materials or condition therein.

EXAMPLE I

Each of raw material powder of $Pb_2O_3$, $ZrO_2$, $TiO_2$, $BaCO_3$, ZnO, $SrCO_3$, $Sb_2O_3$, NiO and $TeO_2$, which were high purity as raw material powder, was weighed in a predetermined amount such that a sintered body became a composition expressed by $Pb_{1-x-y}Sr_xBa_y(Zn_{1/3}Sb_{2/3})_a(Ni_{1/2}Te_{1/2})_bZr_{1-a-b-c}Ti_cO_3$ (x=0.04, y=0.02, a=0.075, b=0.995, and c=0.42). To this composition, excess Pb was added in an amount indicated in Table 1.

The prepared powder was mixed in wet process with a ball mill for 20 hours. Thereafter, the mixture was dewatered and dried. This was then calcined at 900° C. for three hours. The obtained calcined matter was crushed twice in wet process with a ball mill.

Subsequently, an organic binder, water, dispersant and plasticizer were added to the crushed matter and mixed to obtain slurry. In order to mold a thin green sheet from this slurry, a green sheet taking its shrinkage percentage into consideration such that the thickness after firing had the value indicated in Table 1, was prepared in a generally known roll coater process.

The obtained green sheet was then died out in a rectangular shape by using a mold, and a plurality of rectangular sheets were prepared. Subsequently, a common electrode and separate electrodes were applied to each of the rectangular sheet surface by screen-printing with use of an electrode paste composed of Ag—Pd.

Next, the green sheet to which the electrodes were applied and the green sheet to which no electrodes were applied were stacked so as to obtain the structure shown in FIGS. 1(a) and 1(b), namely, such that a plurality of displacement elements were formed on the substrate. This was then pressurized while heating, thereby preparing a laminated actuator molding body.

Finally, after this molding body was debindered at 400° C., firing was carried out for two hours under the conditions shown in Table 1, thereby obtaining an actuator.

The thickness of the obtained actuator was measured with a micrometer. The sintered body was cut and its cross section was observed by EPMA, and the quantitative measurements of Pb, Ti and Zr in the inside of the above-mentioned substrate were made to find a composition ratio Pb/(Ti+Zr). Then, a difference in the composition ratios between the surface of the piezoelectric ceramic layer and the inside of the, substrate was calculated.

After the sintered body was cut and its cross section was processed into a mirror-finished surface, this was observed with a microscope and the area of pores within a predetermined area was found to calculate porosity. By resonance method with use of an impedance analyzer, ten locations in the mirror-finished surface were measured, and its mean value was calculated to find the piezoelectric property $d_{31}$ of the actuator. The piezoelectric property $d_{31}$ was indicated as the absolute value.

Next, the actuator was applied to an inkjet printing head. With a laser Doppler vibrometer, the displacement amounts of displacement elements at ten locations were measured, and its mean value was calculated to find a displacement variation at that time. To obtain the variation, the largest value of the difference between each displacement amount and the mean value was divided by the mean value, and the result was expressed by percentage.

TABLE 1

| Sample No. | Green Sheet Excess Pb (wt %) | Green Sheet Raw Density g/cm³ | Firing Condition Temp. °C | Firing Condition O₂ Concentration in Atmosphere % | Actuator Thickness μm | Actuator Pb/(Ti + Zr) Surface | Actuator Pb/(Ti + Zr) Inside | Actuator Pb/(Ti + Zr) Difference | Porosity % | Evaluation $d_{31}$ Mean pm/V | Evaluation Displacement Variation % |
|---|---|---|---|---|---|---|---|---|---|---|---|
| *I-1 | 0 | 4.5 | 1000 | 98 | 15 | 0.960 | 1.000 | 0.040 | 0.8 | 190 | 8.0 |
| I-2 | 1 | 4.5 | 1000 | 98 | 15 | 0.970 | 0.982 | 0.012 | 0.8 | 270 | 1.2 |
| I-3 | 2 | 4.5 | 1000 | 98 | 15 | 0.971 | 0.984 | 0.013 | 0.8 | 290 | 1.3 |
| I-4 | 3 | 4.5 | 1000 | 98 | 15 | 0.982 | 0.997 | 0.015 | 0.8 | 280 | 1.6 |
| I-5 | 5 | 4.5 | 1000 | 98 | 15 | 0.991 | 1.008 | 0.017 | 0.8 | 260 | 1.8 |
| I-6 | 6 | 4.5 | 1000 | 98 | 15 | 1.000 | 1.020 | 0.020 | 0.8 | 200 | 2.0 |
| I-7 | 2 | 4.5 | 1000 | 98 | 1 | 0.971 | 0.986 | 0.015 | 0.8 | 340 | 2.0 |
| I-8 | 2 | 4.5 | 1000 | 98 | 3 | 0.970 | 0.985 | 0.015 | 0.8 | 330 | 1.9 |
| I-9 | 2 | 4.5 | 1000 | 98 | 5 | 0.971 | 0.986 | 0.015 | 0.8 | 325 | 1.8 |
| I-10 | 2 | 4.5 | 1000 | 98 | 10 | 0.972 | 0.987 | 0.015 | 0.8 | 320 | 1.7 |
| I-11 | 2 | 4.5 | 1000 | 98 | 30 | 0.969 | 0.984 | 0.015 | 0.8 | 250 | 1.5 |
| I-12 | 2 | 4.5 | 1000 | 98 | 50 | 0.971 | 0.986 | 0.015 | 0.9 | 220 | 1.3 |
| I-13 | 2 | 4.5 | 1000 | 98 | 65 | 0.972 | 0.987 | 0.015 | 0.9 | 220 | 1.3 |
| I-14 | 2 | 4.5 | 1000 | 98 | 80 | 0.968 | 0.983 | 0.015 | 1 | 220 | 1.5 |
| I-15 | 2 | 4.5 | 1000 | 98 | 100 | 0.972 | 0.987 | 0.015 | 1.1 | 200 | 1.6 |
| *I-16 | 2 | 4.5 | 1000 | 98 | 150 | 0.970 | 0.985 | 0.015 | 1.3 | 150 | 2.1 |
| I-17 | 2 | 4.5 | 920 | 98 | 15 | 0.971 | 0.985 | 0.014 | 2 | 200 | 2.0 |
| I-18 | 2 | 4.5 | 1000 | 98 | 15 | 0.970 | 0.985 | 0.015 | 0.5 | 295 | 1.5 |
| I-19 | 2 | 4.5 | 1100 | 98 | 15 | 0.960 | 0.980 | 0.020 | 0.9 | 280 | 2.0 |
| *I-20 | 2 | 4.5 | 1200 | 98 | 15 | 0.951 | 0.986 | 0.035 | 0.9 | 265 | 5.5 |
| I-21 | 2 | 4.2 | 1000 | 98 | 15 | 0.972 | 0.989 | 0.017 | 1 | 220 | 2.0 |
| I-22 | 2 | 4.5 | 1000 | 98 | 15 | 0.971 | 0.986 | 0.015 | 0.6 | 260 | 1.6 |
| I-23 | 2 | 4.8 | 1000 | 98 | 15 | 0.971 | 0.986 | 0.015 | 0.4 | 280 | 1.5 |
| I-24 | 2 | 4.5 | 1000 | 99 | 15 | 0.968 | 0.980 | 0.012 | 0.4 | 270 | 1.4 |
| I-25 | 2 | 4.5 | 1000 | 99.9 | 15 | 0.970 | 0.981 | 0.011 | 0.3 | 290 | 1.3 |

Sample numbers marked with * are not within the scope of the present invention.

As to Sample Nos. I-2 to I-15, I-17 to I-19 and I-21 to I-25 of the present invention, $d_{31}$ was 200 pm/V or more, and the displacement variation was 2% or less. From these values, it was confirmed that they can satisfactorily function as an inkjet printer.

Whereas in Sample No. I-1 in which Pb was prepared as a stoichiometric composition, the maximum value of composition ratio Pb/(Ti+Zr) was as great as 0.04, so that $d_{31}$ was as low as 190 pm/V, and the displacement variation was as great as 8%. In Sample No. I-16 that was as great as 150 μm in the actuator thickness, $d_{31}$ was as low as 150 pm/V, resulting in insufficient characteristics as the printing head of an inkjet printer. In Sample No. I-20 that was as great as 0.035 in the maximum difference of composition ratio Pb/(Ti+Zr) because its sintering temperature was as high as 1200° C., the displacement variation was as great as 5.5%.

EXAMPLE II

Each of raw material powder of $Pb_2O_3$, $ZrO_2$, $TiO_2$, $BaCO_3$, $ZnO$, $SrCO_3$, $Sb_2O_3$, $NiO$ and $TeO_2$, which were high purity as raw material powder, was weighed in a predetermined amount so as to be a composition shown in Table 2, and excess Pb was added to this composition. The compositions of Table 2 indicate the mole numbers of x, y, a, b and c in a general formula: $Pb_{1-x-y}Sr_xBa_y(Zn_{1/3}Sb_{2/3})_a(Ni_{1/2}Te_{1/2})_bZr_{1-a-b-c}Ti_cO_3$. Sample No. II-25 used $BaTiO_3$.

The prepared powder was mixed in wet process with a ball mill for 20 hours. Thereafter, the mixture was dewatered and dried. This was then calcined at 900° C. for three hours. The obtained calcined matter was crushed twice in wet process with a ball mill.

Subsequently, any organic binder, water, dispersant and plasticizer were added to the crushed matter and mixed to obtain slurry. A green sheet taking its shrinkage percentage into consideration such that the thickness after firing had the value indicated in Table 2, was prepared in roll coater process.

The obtained green sheet was then died out in a rectangular shape by using a mold, and a plurality of rectangular sheets were prepared. Subsequently, a common electrode and separate electrodes were applied to each of the rectangular sheet surfaces by screen-printing with use of an electrode paste composed of Ag—Pd.

Next, the green sheet to which the electrodes were applied and the green sheet to which no electrodes were applied were stacked so as to obtain the structure shown in FIGS. 1(a) and 1(b), namely, so as to form ten displacement elements longitudinally and twenty displacement elements laterally on the substrate surface. This was then pressurized while heating, thereby preparing a laminated actuator molding body.

Lastly, after this molding body was debindered at 400° C., five type of laminates were fired in an atmosphere of 99% $O_2$ at 1000° C. for two hours, thereby obtaining five types of actuators.

After grinding the cross section of the sintered body, the thickness of each of the obtained actuators was measured with a microscope available from Keyence Corp., using CCD. A piezoelectric ceramic layer was cut, and the quantitative measurement of Pb, Ti and Zr in its cross section was made to find a composition variation, as a composition ratio Pb/(Ti+Zr). Further, after the piezoelectric ceramic layer was cut and its cross section was processed into a mirror-finished surface, this was observed with a microscope. To calculate porosity, the area of voids within a predetermined area was found and divided by the entire area.

The above-mentioned composition variation was measured with EPMA by comparing the amounts of Pb, Zr and Ti with that of an internal standard sample. The obtained amounts of Pb, Zr and Ti were converted into molar amount, and a Pb/(Ti+Zr) ratio was calculated. The lattice constant ratio c/a of a perovskite compound was calculated by substituting d(002) interplanar spacing and d(200) interplanar spacing in an X-ray diffraction, into the following equation:

$$1/d^2 = h^2 + k^2 + (a/c)^2 l^2/a^2$$

In addition, $d_{31}$ of the actuator was measured by resonance method with use of an impedance analyzer. Elastic compliance $S_{11}^{E}$ was measured by using the density of the sintered body and resonance frequency.

Next, the actuator was bonded to a passage member and a printing head as shown in FIG. 2(a) was prepared. The electrostatic capacities before and after bonding were measured with the impedance analyzer. Then, the after-bonding value against the before-bonding value was calculated as a change rate. The displacement caused when voltage had been impressed to each displacement element was measured with a Doppler measuring device, and a planar displacement variation was calculated. To obtain the variation, the maximum difference from a means value was divided by the mean value, and the result was expressed by percentage. Table 2 shows the results.

TABLE 2

| Sample No. | Main Phase | Composition | | | | | Rate of Excess Pb | Composition Variation % | Porosity % | c/a | Actuator Properties | | | Printing Head | | |
|---|---|---|---|---|---|---|---|---|---|---|---|---|---|---|---|---|
| | | x mol | y mol | a mol | b mol | c mol | | | | | Thickness μm | d31 pm/V | $S_{11}^{E}$ $10^{-12}$ m²/N | Change rate of Electrostatic capacity % | Displacement Amount Mean nm | Variation % |
| *II-1 | A1 | 0.06 | 0.02 | 0.075 | 0.005 | 0.45 | 1.02 | 0.02 | 1 | 1.010 | 50 | 190 | 15.4 | 50 | 40 | 15 |
| II-2 | A1 | 0.06 | 0.02 | 0.075 | 0.005 | 0.46 | 1.02 | 0.02 | 0.9 | 1.013 | 50 | 200 | 13 | 35 | 60 | 2 |
| II-3 | A1 | 0.06 | 0.02 | 0.075 | 0.005 | 0.47 | 1.02 | 0.02 | 0.8 | 1.014 | 50 | 220 | 12.5 | 30 | 70 | 2 |
| II-4 | A1 | 0.06 | 0.02 | 0.075 | 0.005 | 0.475 | 1.02 | 0.02 | 0.9 | 1.015 | 50 | 215 | 12 | 25 | 66 | 2 |
| II-5 | A1 | 0.06 | 0.02 | 0.075 | 0.005 | 0.48 | 1.02 | 0.02 | 1 | 1.016 | 50 | 200 | 11.5 | 20 | 62 | 2 |
| *II-6 | A1 | 0.06 | 0.02 | 0.075 | 0.005 | 0.55 | 1.02 | 0.02 | 0.9 | 1.020 | 50 | 150 | 11 | 20 | 25 | 12 |
| II-7 | A1 | 0.06 | 0.02 | 0.075 | 0.005 | 0.47 | 1.02 | 0.02 | 0.9 | 1.014 | 10 | 220 | 12.5 | 30 | 100 | 2 |
| II-8 | A1 | 0.06 | 0.02 | 0.075 | 0.005 | 0.47 | 1.02 | 0.02 | 0.8 | 1.014 | 20 | 225 | 12.4 | 31 | 90 | 2 |
| II-9 | A1 | 0.06 | 0.02 | 0.075 | 0.005 | 0.47 | 1.02 | 0.02 | 0.9 | 1.014 | 70 | 230 | 12.6 | 33 | 50 | 2 |
| II-10 | A1 | 0.06 | 0.02 | 0.075 | 0.005 | 0.47 | 1.02 | 0.02 | 0.9 | 1.014 | 100 | 220 | 12.5 | 30 | 35 | 2 |
| *II-11 | A1 | 0.06 | 0.02 | 0.075 | 0.005 | 0.47 | 1.02 | 0.02 | 1 | 1.014 | 150 | 220 | 12.8 | 30 | 19 | 2 |
| II-12 | A1 | 0.06 | 0.02 | 0.075 | 0.005 | 0.47 | 1.02 | 0.02 | 3 | 1.013 | 50 | 220 | 13.3 | 30 | 60 | 2 |
| II-13 | A1 | 0.06 | 0.02 | 0.075 | 0.005 | 0.46 | 1.02 | 0.02 | 0.8 | 1.012 | 50 | 230 | 13.5 | 33 | 63 | 2 |
| II-14 | A1 | 0.06 | 0.02 | 0.075 | 0.005 | 0.46 | 1.02 | 0.02 | 0.5 | 1.012 | 50 | 235 | 13.7 | 35 | 65 | 2 |
| II-15 | A1 | 0.08 | 0 | 0.075 | 0.005 | 0.47 | 1.02 | 0.02 | 0.9 | 1.014 | 50 | 200 | 12.3 | 25 | 55 | 2 |
| II-16 | A1 | 0.08 | 0.02 | 0.075 | 0.005 | 0.47 | 1.02 | 0.02 | 0.8 | 1.014 | 50 | 250 | 12.3 | 25 | 80 | 2 |
| II-17 | A1 | 0.06 | 0.04 | 0.075 | 0.005 | 0.47 | 1.02 | 0.02 | 1 | 1.013 | 50 | 240 | 13 | 31 | 70 | 2 |
| II-18 | A1 | 0.08 | 0.06 | 0.075 | 0.005 | 0.47 | 1.02 | 0.02 | 0.9 | 1.012 | 50 | 245 | 13.2 | 32 | 60 | 2 |
| II-19 | A1 | 0.06 | 0.02 | 0.075 | 0.005 | 0.47 | 1 | 0.05 | 0.9 | 1.014 | 50 | 205 | 12.5 | 25 | 65 | 2 |
| II-20 | A1 | 0.06 | 0.02 | 0.075 | 0.005 | 0.47 | 1.005 | 0.02 | 1 | 1.014 | 50 | 210 | 12.6 | 25 | 67 | 2 |
| II-21 | A1 | 0.06 | 0.02 | 0.075 | 0.005 | 0.47 | 1.04 | 0.02 | 1 | 1.013 | 50 | 230 | 13 | 30 | 69 | 2 |
| II-22 | A1 | 0.06 | 0.02 | 0.075 | 0.005 | 0.47 | 1.05 | 0.02 | 0.9 | 1.013 | 50 | 200 | 13.2 | 33 | 55 | 2 |
| II-23 | B1 | 0 | 0 | 0.075 | 0.005 | 0.45 | 1 | 0.05 | 0.9 | 1.014 | 50 | 170 | 12 | 22 | 28 | 3 |
| II-24 | C1 | 0 | 0 | 0.000 | 0.000 | 0.5 | 1 | 0.08 | 0.8 | 1.014 | 50 | 160 | 11 | 15 | 25 | 4 |
| *II-25 | D1 | — | — | — | — | — | — | — | 0.9 | 1.014 | 50 | 120.0 | 10.1 | 12 | 10 | 8 |
| II-26 | A1 | 0.06 | 0.02 | 0.075 | 0.005 | 0.47 | 0.995 | 0.05 | 0.9 | 1.013 | 50 | 200 | 12.3 | 23 | 60 | 2 |

Sample numbers marked with * are not within the scope of the present invention.

A1: $Pb_{0.94}Sr_{0.04}Ba_{0.02}(Zn_{1/3}Sb_{2/3})_{0.075}(Ni_{1/2}Te_{1/2})_{0.005}Zr_{0.47}Ti_{0.45}O_3$

B1: $Pb(Zn_{1/3}Sb_{2/3})_{0.075}(Ni_{1/2}Te_{1/2})_{0.005}Zr_{0.47}Ti_{0.45}O_3$

C1: $PbZr_{0.5}Ti_{0.5}O_3$

D1: $BaTiO_3$

As to Sample Nos. II-2 to II-5, II-7 to II-10 and II-12 to II-24 of the present invention, the change rate of electrostatic capacity was 35% or less, the mean displacement amount was 22 nm or more, and its variation was 4% or less. Especially in $Pb_{0.94}Sr_{0.04}Ba_{0.02}(Zn_{1/3}Sb_{2/3})_{0.075}(Ni_{1/2}Te_{1/2})_{0.005}Zr_{0.47}Ti_{0.45}O_3$, the main phase of which was Al, the mean displacement amount was 35 nm or more and its variation was 2%.

Whereas in Sample No. II-1 in which the lattice constant ratio c/a was smaller than 1.013; the change rate of electrostatic capacity was as great as 50%, and the mean displacement amount was 40 nm, while its variation was as great as 15%. In Sample No. II-6 in which the lattice constant ratio c/a was greater than 1.016, the mean displacement amount was 40 nm and its variation was as great as 20%.

In Sample No. II-11 having a thickness of over 100 μm, the mean displacement amount was as small as 20 nm. This was impracticable as an actuator, particularly an actuator used for printing head.

In Sample No. II-25 comprising a perovskite compound not containing Pb and Zr, the mean displacement amount was as small as 10 nm. This was impracticable as an actuator, particularly an actuator used for printing head.

EXAMPLE III

Each of raw material powder of $Pb_2O_3$, $ZrO_2$, $TiO_2$, $BaCO_3$, ZnO, $SrCO_3$, $Sb_2O_3$, NiO and $TeO_2$, which were high purity as raw material powder, was weighed in a predetermined amount such that a sintered body became a composition expressed by $Pb_{1-x-y}Sr_xBa_y(Zn_{1/3}Sb_{2/3})_a(Ni_{1/2}Te_{1/2})_bZr_{1-a-b-c}Ti_cO_3$ (x=0.04, y=0.02, a=0.075, b=0.75, and c=0.45). To this composition, excess Pb was added and mixed in wet process with a ball mill for 20 hours. After the mixture was dewatered and dried, this was calcined at 700 to 900° C. for three hours. The obtained calcined matter was crushed twice in wet process with a ball mill or the like.

Subsequently, an organic binder, water, dispersant and plasticizer were added to the crushed matter and then mixed to obtain slurry. A tape having a thickness of 30 μm was formed in roll coater process. Subsequently, a common electrode and separate electrodes, each having a thickness of 5 μm, were formed on the upper and lower surfaces of the tape by printing method with use of an electrode paste composed of Ag—Pd in 70:30. Then, a tape free of electrodes, and a tape that has its upper and lower surfaces separate electrodes serving as displacement elements for driving and a common electrode were stacked so as to oppose to each other. This was then pressed and tightened at pressure of 12 Mpa, thereby obtaining a laminate.

Finally, after this laminated molding body was debindered at 400° C., firing was carried out at 1100° C. in an atmosphere of 99% $O_2$ for five hours, thereby obtaining an actuator substrate.

After cutting the obtained actuator and grinding its cross section, the entire thickness T and the adhesive layer thickness t were measured with a microscope available from Keyence Corp., using CCD. After the sintered body was cut and its cross section was processed into mirror-finished surface, it was observed with a microscope, and the area of pores within a predetermined area was found to calculate its porosity.

The actuator was joined to a passage member, and an inkjet printing head shown in FIGS. 2(a) and 2(b) was prepared. Binding was carried out by using epoxy adhesive as adhesive, at 150° C. under applied pressure of 1 MPa.

By resonance method with an impedance analyzer, $d_{31}$ at ten locations in the actuator with the passage member were measured, and its mean value was calculated.

Next, an AC electric field of 0 to 20V was impressed at a frequency of 10 KHz to the inkjet printing head, and the displacement amount of the displacement elements at ten location were measured by a laser Doppler displacement meter, and its mean value was employed as a displacement amount. Further, to obtain the displacement variation, the maximum value between each displacement amount and the mean value was divided by the mean value, and the result was expressed by percentage.

Additionally, when a DC voltage of 40 V was impressed on one displacement element, the displacement of this element (vibrated element) and the displacement of the adjacent displacement element (adjacent element) were measured by the Doppler displacement meter, and the influence of the interference therebetween was examined. Table 3 shows the results.

TABLE 3

| | Properties of Actuator | | | | | | Evaluation of Displacement | | |
| | | | | | | | Vibrated Element | | Adjacent Element |
| | Size | | Porosity % | Max. Porosity μm | $d_{31}$ Mean pm/V | Variation % | Mean nm | Variation % | Mean nm |
| Sample No. | T μm | t μm | | | | | | | |
|---|---|---|---|---|---|---|---|---|---|
| III-1 | 5 | 1 | 0.8 | 5 | 300 | 1.5 | 72 | 1.3 | 2 |
| III-2 | 10 | 1 | 0.7 | 5 | 285 | 1.5 | 72 | 1.5 | 3 |
| III-3 | 20 | 1 | 0.9 | 5 | 280 | 1.5 | 71 | 1.5 | 2 |
| III-4 | 45 | 1 | 0.7 | 5 | 260 | 1.5 | 71 | 1.5 | 3 |
| III-5 | 60 | 1 | 0.6 | 5 | 250 | 1.5 | 71 | 1.6 | 2 |
| III-6 | 80 | 1 | 0.8 | 5 | 225 | 1.5 | 71 | 1.6 | 2 |
| III-7 | 100 | 1 | 0.8 | 5 | 200 | 1.5 | 70 | 1.7 | 3 |
| *III-8 | 150 | 1 | 0.9 | 5 | 150 | 1.5 | 48 | 1.7 | 3 |
| *III-9 | 20 | 0.1 | 0.8 | 5 | 270 | 1 | 70 | 10 | 14 |
| III-10 | 20 | 0.5 | 0.9 | 5 | 275 | 1.1 | 70 | 1.1 | 5 |
| III-11 | 20 | 0.8 | 0.7 | 5 | 280 | 1.2 | 71 | 1.3 | 2 |
| III-12 | 20 | 1 | 0.7 | 5 | 285 | 1.5 | 71 | 1.5 | 1 |
| III-13 | 20 | 2 | 0.8 | 5 | 280 | 1.6 | 72 | 1.7 | 1 |
| III-14 | 20 | 3 | 0.7 | 5 | 275 | 2 | 72 | 2 | 2 |
| III-15 | 20 | 5 | 0.9 | 5 | 270 | 2.5 | 74 | 2.6 | 4 |
| *III-16 | 20 | 7 | 0.8 | 5 | 200 | 3 | 74 | 14 | 12 |
| III-17 | 20 | 1 | 0.3 | 5 | 300 | 1 | 2 | 1.1 | 1 |
| III-18 | 20 | 1 | 0.5 | 5 | 290 | 1.5 | 71 | 1.3 | 1 |
| III-19 | 20 | 1 | 1.0 | 5 | 270 | 1.8 | 71 | 1.6 | 2 |
| III-20 | 20 | 1 | 2.0 | 5 | 260 | 3 | 70 | 2.8 | 3 |
| III-21 | 20 | 1 | 0.7 | 3 | 290 | 1.3 | 72 | 1.2 | 1 |
| III-22 | 20 | 1 | 0.7 | 7 | 280 | 1.8 | 71 | 1.7 | 3 |
| III-23 | 20 | 1 | 0.7 | 10 | 275 | 2 | 70 | 1.9 | 5 |

Sample numbers marked with * are not within the scope of the present invention.

In Sample Nos. III-1 to III-7, III-10 to III-15 and III-17 to III-23 of the present invention, $d_{31}$ was 200 pm/V or more, the displacement of vibrated element (mean value) was 70 nm or more, the displacement variation of the vibrated element was 2.8% or less, and the displacement of the adjacent element was 5 nm or less.

Whereas in Sample No. III-8 in which the entire thickness of the actuator was over 100 μm, $d_{31}$ was as small as 150 pm/V, and the displacement of the vibrated element was as small as 48 nm.

In both of Sample No. III-9 in which thickness t of the adhesive layer was smaller than 0.5 μm, and Sample No.

III-16 in which thickness t of the adhesive layer was greater than 0.5 µm, the displacement variation of the vibrated element was 10% or more, and the displacement of the adjacent element was as great as 12 nm.

What is claimed is:

1. An actuator comprising a substrate and displacement element disposed on the surface of said substrate, said displacement element comprising a piezoelectric ceramic layer and a pair of electrodes interposing therebetween said piezoelectric ceramic layer, said piezoelectric ceramic layer and said substrate having as their principal component a perovskite crystal containing at least Pb, Zr and Ti, the maximum difference in composition ratio Pb/(Ti+Zr) between the surface of said piezoelectric ceramic layer and the inside of said substrate being 0.02 or less, and the entire thickness of said actuator being 100 µm or less.

2. The actuator according to claim 1 wherein a plurality of said displacement elements are disposed on the surface of said substrate.

3. The actuator according to claim 1 wherein the porosities of said substrate and said piezoelectric ceramic layer are 1% or less.

4. A printing head comprising a passage member having a plurality of ink passages, and an actuator according to claim 1 which is disposed on said passage member, ink charged in said ink passage being discharged by the displacement of said displacement element constituting said actuator.

5. An actuator comprising a ceramic substrate and a plurality of displacement elements disposed on the surface of said substrate, said displacement elements comprising a piezoelectric ceramic layer and a pair of electrodes interposing therebetween said piezoelectric ceramic layer, said piezoelectric ceramic layer comprising a perovskite compound containing Pb, Zr and Ti, the lattice constant ratio c/a of said perovskite compound being 1.013 to 1.016, said actuator having a thickness of 100 µm or less wherein the maximum difference in composition ratio Pb/(Ti+Zr) between the surface of said piezoelectric ceramic layer and the inside of said ceramic substrate is 0.02 or less.

6. The actuator according to claim 5 wherein said perovskite compound is a lead zirconate titanate-based compound.

7. The actuator according to claim 5 wherein said piezoelectric ceramic layer contains at least one selected from Sr, Ba, Ni, Sb, Nb, Zn and Te.

8. The actuator according to claim 5 wherein said piezoelectric ceramic layer contains Ba in an amount of 0.02 to 0.08 mol, and Sr in amount of 0.02 to 0.12 mol.

9. The actuator according to claim 5 wherein said piezoelectric ceramic layer contains Pb exceeding the amount of Pb required from the stoichiometric ratio of said perovskite compound, and the excess ratio at site A is 1.005 to 1.04.

10. The actuator according to claim 5 wherein said ceramic substrate is a piezoelectric element.

11. The actuator according to claim 5 wherein a constraint part is bonded via an adhesive layer to a part of said ceramic substrate, and displacement occurs at a non-constraint part.

12. The actuator according to claim 5 wherein the magnitude of $d_{31}$ is 200 pm/V or more.

13. The actuator according to claim 5 wherein elastic compliance is $14.0 \times 10^{-12}$ m²/N or less.

14. A printing head comprising a passage member having a plurality of ink passages, and an actuator according to claim 5 which is joined onto said passage member such that displacement element constituting said actuator is located immediately above said ink passage, ink charged in said ink passage being discharged by the displacement of said displacement element.

* * * * *